United States Patent
Klebanov et al.

(10) Patent No.: US 11,782,105 B2
(45) Date of Patent: Oct. 10, 2023

(54) FABRICATING PLANARIZED COIL LAYER IN CONTACT WITH MAGNETORESISTANCE ELEMENT

(71) Applicant: Allegro MicroSystems, LLC, Manchester, NH (US)

(72) Inventors: Maxim Klebanov, Palm Coast, FL (US); Yen Ting Liu, Hsinchu (TW); Paolo Campiglio, Arcueil (FR); Sundar Chetlur, Frisco, TX (US); Harianto Wong, Southborough, MA (US)

(73) Assignee: Allegro MicroSystems, LLC, Manchester, NH (US)

( * ) Notice: Subject to any disclaimer, the term of this patent is extended or adjusted under 35 U.S.C. 154(b) by 0 days.

(21) Appl. No.: 17/648,151

(22) Filed: Jan. 17, 2022

(65) Prior Publication Data

US 2023/0228828 A1    Jul. 20, 2023

(51) Int. Cl.
*G01R 33/09*    (2006.01)
*G01R 3/00*    (2006.01)

(52) U.S. Cl.
CPC ............ *G01R 33/093* (2013.01); *G01R 3/00* (2013.01); *G01R 33/098* (2013.01)

(58) Field of Classification Search
CPC ....... G01R 33/093; G01R 3/00; G01R 33/098
See application file for complete search history.

(56) References Cited

U.S. PATENT DOCUMENTS

| | | |
|---|---|---|
| 5,764,052 A | 6/1998 | Renger |
| 5,831,426 A | 11/1998 | Black, Jr. et al. |
| 6,473,275 B1 | 10/2002 | Gill |
| 7,001,783 B2 | 2/2006 | Costrini et al. |
| 7,259,545 B2 | 8/2007 | Stauth et al. |
| 7,511,483 B2 | 3/2009 | Pannetier et al. |
| 7,923,996 B2 | 4/2011 | Doogue et al. |
| 8,030,918 B2 | 10/2011 | Doogue et al. |
| 8,447,556 B2 | 5/2013 | Friedrich et al. |
| 8,542,010 B2 | 9/2013 | Cesaretti et al. |

(Continued)

FOREIGN PATENT DOCUMENTS

DE    10 2006 010 652 A1    9/2007
EP        3 293 889 A1    3/2018

(Continued)

OTHER PUBLICATIONS

U.S. Appl. No. 17/648,154, filed Jan. 17, 2022, Liu et al.

(Continued)

*Primary Examiner* — Alvaro E Fortich
(74) *Attorney, Agent, or Firm* — DALY, CROWLEY, MOFFORD & DURKEE, LLP

(57) ABSTRACT

In one aspect, a method includes forming a coil in a coil layer, performing planarization on the coil layer, and depositing a magnetoresistance (MR) element on the planarized coil layer. No dielectric material is between the planarized coil layer and the MR element. In another aspect, a magnetic field sensor includes a substrate, a planarized coil layer comprising a coil on the substrate, a magnetoresistance (MR) element in contact with the planarized coil layer, and a capping layer deposited over the MR element and the planarized coil layer. No dielectric material is between the planarized coil layer and the MR element.

28 Claims, 16 Drawing Sheets

(56) References Cited

U.S. PATENT DOCUMENTS

| | | | |
|---|---|---|---|
| 8,680,846 | B2 | 3/2014 | Cesaretti et al. |
| 8,692,546 | B2 | 4/2014 | Cesaretti et al. |
| 8,747,680 | B1 | 6/2014 | Deshpande et al. |
| 8,818,749 | B2 | 8/2014 | Friedrich et al. |
| 8,848,320 | B1 | 9/2014 | David et al. |
| 8,885,302 | B1 | 11/2014 | David et al. |
| 8,907,669 | B2 | 12/2014 | Petrie |
| 9,013,838 | B1 | 4/2015 | Erie et al. |
| 9,151,807 | B2 | 10/2015 | Friedrich et al. |
| 9,201,122 | B2 | 12/2015 | Cesaretti et al. |
| 9,645,220 | B2 | 5/2017 | Cesaretti et al. |
| 9,804,222 | B2 | 10/2017 | Petrie et al. |
| 9,841,485 | B2 | 12/2017 | Petrie et al. |
| 10,050,193 | B1 | 8/2018 | Klebanov et al. |
| 10,074,939 | B1 | 9/2018 | Briano |
| 10,132,879 | B2 | 11/2018 | Latham et al. |
| 10,234,513 | B2 | 3/2019 | Vig et al. |
| 10,396,279 | B2 | 8/2019 | Deshpande et al. |
| 10,451,671 | B2 | 10/2019 | Petrie et al. |
| 10,466,298 | B2 | 11/2019 | Chaware et al. |
| 10,566,526 | B1 | 2/2020 | Liu et al. |
| 10,761,120 | B2 | 9/2020 | Feucht et al. |
| 10,868,240 | B2 | 12/2020 | Liu et al. |
| 10,884,031 | B2 | 1/2021 | Vuillermet et al. |
| 10,908,232 | B2 | 2/2021 | Latham et al. |
| 10,916,438 | B2 | 2/2021 | Klebanov et al. |
| 11,005,036 | B2 | 5/2021 | Liu et al. |
| 11,112,230 | B2 | 9/2021 | Latham et al. |
| 11,115,084 | B2 | 9/2021 | Latham et al. |
| 11,193,989 | B2 | 12/2021 | Campiglio et al. |
| 2003/0042571 | A1 | 3/2003 | Chen et al. |
| 2004/0012056 | A1 | 1/2004 | Nejad et al. |
| 2004/0014243 | A1 | 1/2004 | Drewes |
| 2004/0100727 | A1 | 5/2004 | Sato et al. |
| 2004/0184199 | A1* | 9/2004 | Nakashio ............... B82Y 25/00 |
| 2004/0211661 | A1* | 10/2004 | Zhang ................... C23C 14/345 |
| | | | 204/192.12 |
| 2004/0240106 | A1* | 12/2004 | Iitsuka ................. G11B 5/3906 |
| | | | 360/123.41 |
| 2006/0114607 | A1 | 6/2006 | Pinarbasi et al. |
| 2007/0216408 | A1 | 9/2007 | Ando et al. |
| 2008/0144231 | A1 | 6/2008 | Sato et al. |
| 2009/0015252 | A1 | 1/2009 | Raberg et al. |
| 2009/0026266 | A1 | 1/2009 | Raggam |
| 2009/0218657 | A1 | 9/2009 | Rofougaran |
| 2011/0008915 | A1 | 1/2011 | Nozieres et al. |
| 2011/0169488 | A1 | 7/2011 | Mather |
| 2011/0187361 | A1 | 8/2011 | Vanhelmont et al. |
| 2013/0032908 | A1 | 2/2013 | Tang et al. |
| 2013/0055052 | A1 | 2/2013 | Kaeriyama |
| 2013/0241543 | A1 | 9/2013 | Stenson et al. |
| 2014/0332914 | A1 | 11/2014 | Liou et al. |
| 2014/0353785 | A1 | 12/2014 | Paci |
| 2015/0084972 | A1 | 3/2015 | Wu et al. |
| 2015/0194597 | A1 | 7/2015 | Fermon et al. |
| 2015/0200355 | A1 | 7/2015 | Erie et al. |
| 2016/0149416 | A1 | 5/2016 | Ha et al. |
| 2016/0164463 | A1 | 6/2016 | Zhou et al. |
| 2016/0202329 | A1* | 7/2016 | Paci .................... G01R 33/0011 |
| | | | 324/252 |
| 2016/0260772 | A1 | 9/2016 | Usami et al. |
| 2017/0371007 | A1 | 12/2017 | Anderson et al. |
| 2018/0033955 | A1 | 2/2018 | Wong et al. |
| 2018/0074016 | A1 | 3/2018 | Chen et al. |
| 2019/0195966 | A1* | 6/2019 | Watanabe ............ G01R 33/091 |
| 2020/0066580 | A1 | 2/2020 | Peng et al. |
| 2020/0066967 | A1 | 2/2020 | Suri et al. |
| 2020/0075846 | A1* | 3/2020 | Liu ........................ H10N 50/01 |
| 2020/0266337 | A1 | 8/2020 | Liu et al. |
| 2021/0057642 | A1 | 2/2021 | Liu et al. |

FOREIGN PATENT DOCUMENTS

| | | |
|---|---|---|
| JP | 2001-5211670 A | 11/2001 |
| JP | 2013-229867 A | 11/2013 |
| JP | 2014-197368 A | 10/2014 |
| JP | 2015-149731 A | 8/2015 |
| JP | 2016-010070 A | 1/2016 |

OTHER PUBLICATIONS

Analog Devices, "5.0 kV rms Quad Digital Isolators;" Data Sheet ADuM240D/ADuM240E/ADuM241D/ADuM241E/ADuM242ED/ADuM242E; Retrieved from www.analog.com; Jan. 2016; 26 Pages.

Brazzle et al., "Solution Hardened Platinum Alloy Flexure Materials for Improved Performance and Reliability of MEMS Devices;" Journal of Micromechanics and Microengineering, vol. 15, No. 1; Oct. 1, 2004; pp. 43-48; 6 Pages.

Daughton, "Spin-Dependent Sensors;" Invited Paper, Proceedings of the IEEE, vol. 91, No. 5; May 2003; pp. 681-686; 6 Pages.

MicroChem, "LOR and PMGI Resists;" Data Sheet Rev. A; Retrieved from http://microchem.com/pdf/PMGI-Resists-data-sheetV-rhcedit-100311.pdf; Jul. 28, 2014; 8 Pages.

MicroChem, "PMGI & LOR Lift-off Resists;" Product Description; Retrieved from http://www.microhem.com/Prod-PMGI_LOR.htm; Feb. 14, 2012; 2 Pages.

NVE Corporation, "High Speed Digital Isolators;" IL710; Rev. AE; Retrieved from www.IsoLoop.com; Nov. 2016; 14 Pages.

Taylor et al., "A High Fill Factor Linear Mirror Array for a Wavelength Selective Switch;" Journal of Micromechanics and Microengineering, vol. 14, No. 1; Oct. 14, 2003; pp. 147-152; 6 Pages.

Non-Final Office Action dated Mar. 24, 2017 from U.S. App. No. 15/219,694; 17 Pages.

Response to Office Action dated Mar. 24, 2017 for U.S. Appl. No. 15/219,694, filed Jun. 22, 2017; 12 Pages.

Restriction Requirement dated Apr. 21, 2017 for U.S. Appl. No. 15/195,124; 5 Pages.

Response to Restriction Requirement dated Apr. 21, 2017 for U.S. Appl. No. 15/195,124, filed May 18, 2017; 1 Page.

Non-Final Office Action dated Jul. 14, 2017 for U.S. Appl. No. 15/195,124; 7 Pages.

U.S. Restriction Requirement dated Oct. 3, 2019 for U.S. Appl. No. 16/122,019; 4 Pages.

Response to U.S. Restriction Requirement dated Oct. 3, 2019 for U.S. Appl. No. 16/122,019; Response filed Oct. 7, 2019; 1 Page.

U.S. Ex Parte Quayle Action dated Oct. 22, 2019 for U.S. Appl. No. 16/122,019; 7 Pages.

Response to U.S. Ex Parte Quayle Action dated Oct. 22, 2019 for U.S. Appl. No. 16/122,019; Response filed Oct. 22, 2019; 7 Pages.

U.S. Notice of Allowance dated Nov. 25, 2019 for U.S. Appl. No. 16/122,019; 5 Pages.

PCT International Search Report and Written Opinion dated Dec. 12, 2019 for International Application No. PCT/US2019/053054; 14 Pages.

U.S. Ex Parte Quayle Action dated Mar. 10, 2021 U.S. Appl. No. 16/732,679; 6 Pages.

Response to U.S. Ex Parte Quayle Action dated Mar. 10, 2021 U.S. Appl. No. 16/732,679; Response filed Mar. 16, 2021; 8 Pages.

U.S. Notice of Allowance dated Mar. 24, 2021 U.S. Appl. No. 16/732,679; 5 Pages.

PCT International Preliminary Report dated Jun. 10, 2021 for International Application No. PCT/US2019/053054; 10 Pages.

European Communication Pursuant to Rules 161 and 162 dated Mar. 30, 2021 for European Application No. 19786422.6; 3 Pages.

Response to European Communication Pursuant to Rules 161 and 162 dated Mar. 30, 2021 for European Application No. 19786422.6; Response filed Sep. 27, 2021; 9 Pages.

1$^{st}$ U.S. Non-Final Office Action dated Sep. 25, 2019 for U.S. Appl. No. 16/200,799; 12 Pages.

Response to 1$^{st}$ U.S. Non-Final Office Action dated Sep. 25, 2019 for U.S. Appl. No. 16/200,799; Response filed Dec. 18, 2019; 15 Pages.

(56) References Cited

OTHER PUBLICATIONS

1st U.S. Final Office Action dated Jan. 17, 2020 for U.S. Appl. No. 16/200,799; 13 Pages.
Response to 1st U.S. Final Office Action dated Jan. 17, 2020 for U.S. Appl. No. 16/200,799; Response filed Apr. 13, 2020; 14 Pages.
2nd U.S. Non-Final Office Action dated Jun. 23, 2020 for U.S. Appl. No. 16/200,799; 14 Pages.
Response to 2nd U.S. Non-Final Office Action dated Jun. 23, 2020 for U.S. Appl. No. 16/200,799; Response filed Sep. 8, 2020; 10 Pages.
2nd U.S. Final Office Action dated Dec. 8, 2020 for U.S. Appl. No. 16/200,799; 13 Pages.
Appeal Brief filed on Mar. 9, 2021 for U.S. Appl. No. 16/200,799; 21 Pages.
U.S. Notice of Allowance dated Jun. 16, 2021 for U.S. Appl. No. 16/200,799; 6 Pages.
U.S. Appl. No. 16/047,342, filed Jul. 27, 2018, Campiglio et al.
U.S. Non-Final Office Action dated Jun. 13, 2019 for U.S. Appl. No. 15/600,186; 15 Pages.
U.S. Non-Final Office Action dated Jun. 14, 2019 for U.S. Appl. No. 15/991,491; 15 Pages.
U.S. Restriction Requirement dated Feb. 7, 2020 for U.S. Appl. No. 16/280,199; 6 Pages.
Response to U.S. Restriction Requirement dated Feb. 7, 2020 for U.S. Appl. No. 16/280,199; Response filed Feb. 26, 2020; 1 Page.
U.S. Non-Final Office Action dated Mar. 27, 2020 for U.S. Appl. No. 16/280,199; 10 Pages.
Response to U.S. Non-Final Office Action dated Mar. 27, 2020 for U.S. Appl. No. 16/280,199; Response filed Jun. 25, 2020; 10 Pages.
U.S. Notice of Allowance dated Aug. 26, 2020 for U.S. Appl. No. 16/280,199; 13 Pages.
PCT International Search Report and Written Opinion of the ISA dated Sep. 26, 2019 for International Application No. PCT/US2019/037629; 13 Pages.
PCT International Preliminary Report dated Feb. 11, 2021 for International Application No. PCT/US2019/037629; 8 Pages.
U.S. Restriction Requirement dated May 8, 2020 for U.S. Appl. No. 16/047,342; 6 Pages.
Response to Restriction Requirement filed on Jun. 24, 2020 for U.S. Appl. No. 16/047,342; 1 page.
Office Action dated Oct. 14, 2020 for U.S. Appl. No. 16/047,342; 10 pages.
Response to Office Action filed on Dec. 29, 2020 for U.S. Appl. No. 16/047,342; 14 pages.
Final Office Action dated May 5, 2021 for U.S. Appl. No. 16/047,342; 15 pages.
Response to U.S. Final Office Action dated May 5, 2021 for U.S. Appl. No. 16/047,342; Response filed Jul. 2, 2021; 15 Pages.
Advisory Action dated Jul. 15, 2021 for U.S. Appl. No. 16/047,342; 2 Pages.
Preliminary Amendment (Supplemental Amendment) filed on Sep. 27, 2021 for U.S. Appl. No. 16/047,342; 10 Pages.
U.S. Notice of Allowance dated Oct. 1, 2021 for U.S. Appl. No. 16/047,342; 11 Pages.
Response (with Amended Claims) to European Communication dated Mar. 10, 2021 for European Application No. 19735086.1; Response filed Sep. 14, 2021; 27 Pages.
U.S. Non-Final Office Action dated Aug. 10, 2021 for U.S. Appl. No. 17/089,798; 9 Pages.
Response to U.S. Non-Final Office Action dated Aug. 10, 2021 for U.S. Appl. No. 17/089,798; Response filed Oct. 12, 2021; 7 Pages.
U.S. Final Office Action dated Nov. 15, 2021 for U.S. Appl. No. 17/089,798; 10 Pages.
U.S. Appl. No. 17/218,315, filed Mar. 31, 2021, Rubinsztain et al.
U.S. Notice of Allowance dated Mar. 2, 2023 for U.S. Appl. No. 17/648,154; 10 Pages.
Japanese Office Action (with English Translation) dated May 29, 2023 for Japanese Application No. 2021-524042; 6 Pages.
European Intention to Grant dated Jul. 7, 2023 for European Application No. 19786422.6; 37 Pages.

* cited by examiner

FABRICATING PLANARIZED COIL LAYER IN CONTACT WITH MAGNETORESISTANCE ELEMENT

BACKGROUND

A magnetic field sensing element is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. There are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

SUMMARY

In one aspect, a method includes forming a coil in a coil layer, performing planarization on the coil layer, and depositing a magnetoresistance (MR) element on the planarized coil layer. No dielectric material is between the planarized coil layer and the MR element.

In another aspect, a magnetic field sensor includes a substrate, a planarized coil layer comprising a coil on the substrate, a magnetoresistance (MR) element in contact with the planarized coil layer, and a capping layer deposited over the MR element and the planarized coil layer. No dielectric material is between the planarized coil layer and the MR element.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAIL DESCRIPTION

Described herein are techniques to fabricate a planarized coil layer, which includes a coil, that is in contact with a magnetoresistance (MR) element. In particular, there is no dielectric material between the coil layer and the MR element, which is sometimes referred to as having a gapless coil. In one example, a surface of a coil layer has been planarized using chemical mechanical polishing (CMP) so that the MR element may be directly attached to the planarized coil layer.

Figure 1A:
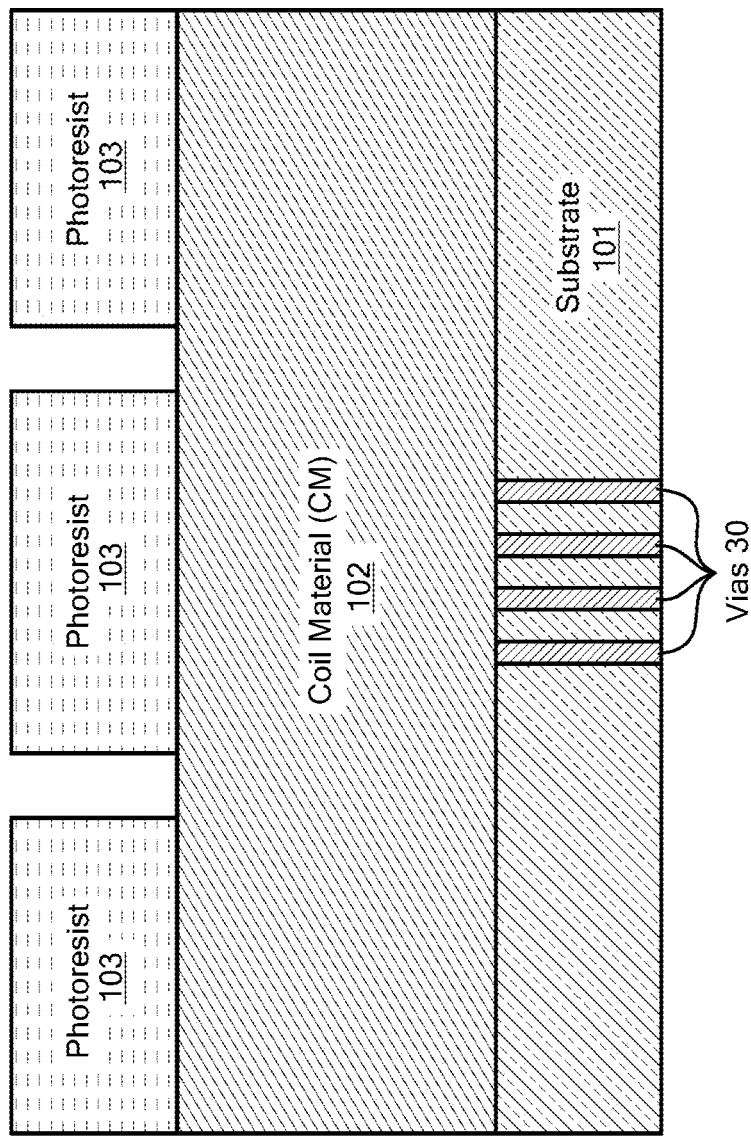
FIGS. 1A to 1M are diagrams of one example to fabricate a planarized coil in contact with a magnetoresistance (MR) element.

Referring to FIG. 1A, a substrate 101 includes vias 30. In one example, the vias 30 include electroconductive material (e.g., tungsten). Coil material 102 is deposited on the substrate 101 and on the vias 30. The coil material 102 includes electroconductive material. For example, the electroconductive material in the coil material 102 may include titanium nitride (TiN).

Figure 1B:
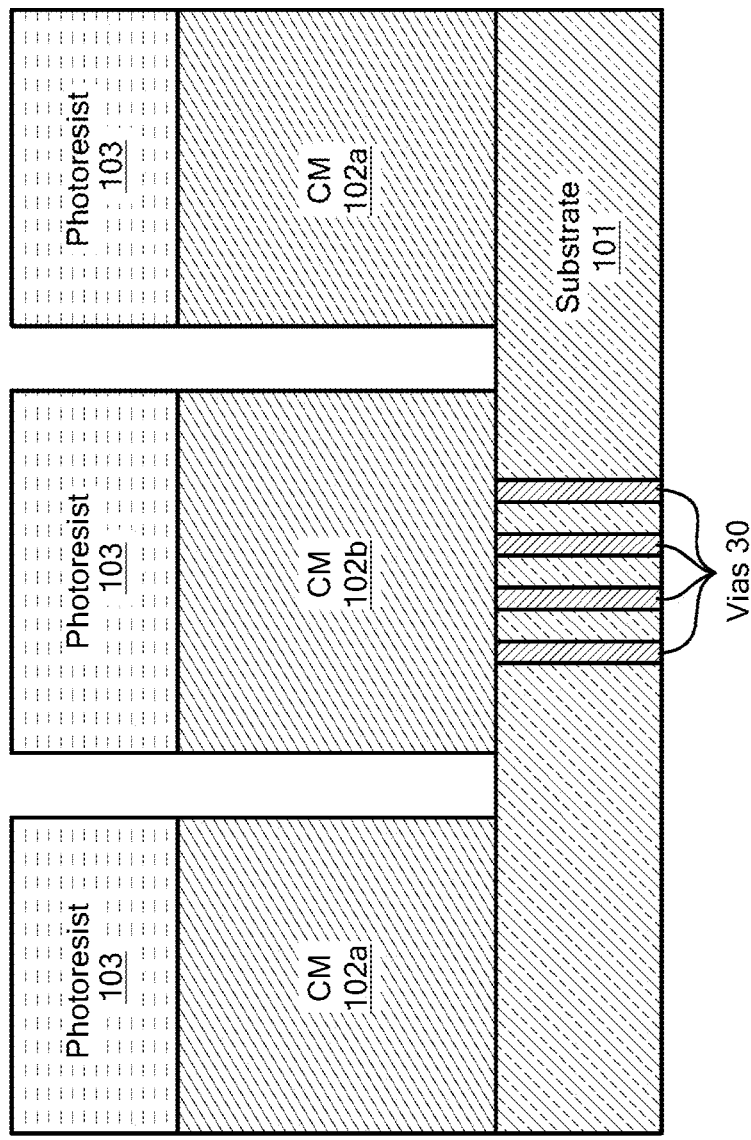

As will be further described, the coil material 102 will be etched to form a coil material 102a and a coil material 102b (see, for example, FIG. 1B and so forth). The coil material 102a is a coil. As used herein, the terms coil material 102a and the term coil 102a are used interchangeably.

Electrical signals may be conducted through vias (not shown) to the coil 102a. In one example, the electrical signals may be used to generate a magnetic field from the coil 102a. In other examples, the coil 102a may be used to pick-up an induced electromotive force caused by a changing magnetic field received at the coil 102a.

In some embodiments, the substrate 101 does not have to support electronic circuitry, but may be, for example, a dummy substrate that only supports a magnetoresistance element. In one example, the substrate 101 may include any material suitable for supporting electronic circuitry. In some embodiments, the substrate 101 may include a semiconductor material, including but not limited to silicon, germanium, gallium arsenide, and/or other types of semiconductor materials. In other embodiments, the substrate 101 may include diamond, glass, ceramic, polymer and/or other materials. In one particular example, the substrate 101 is silicon dioxide or silicon nitride. In other examples, the substrate 101 may include both semiconductor and non-semiconductor materials.

A photoresist is deposited on the coil material 102. The photoresist is patterned using photolithography to expose regions of the coil material 102 that will be removed to define a coil. The remaining photoresist 103 protects the portions of the coil material 102 that will not be removed and not exposed.

Figure 1C:
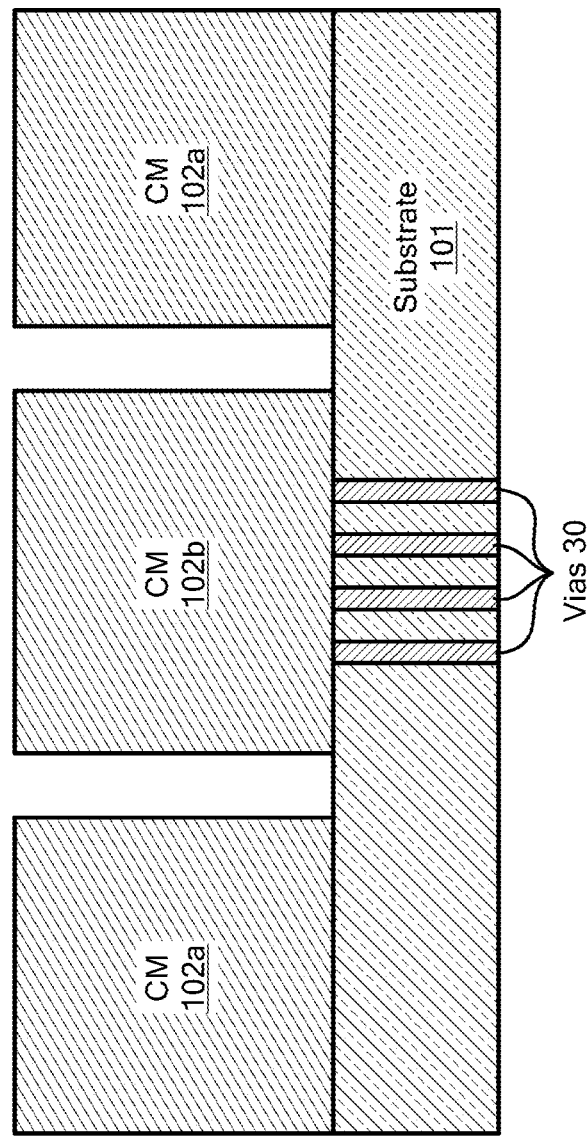

Referring to FIG. 1B, the exposed portions of the coil material 102 are removed to form a coil leaving the coil material 102a and the coil material 102b. The coil material 102a is used to form the coil 102a and the coil material 102b is a connector to the vias 30. Referring to FIG. 1C, the photoresist 103 is removed.

Figure 1D:
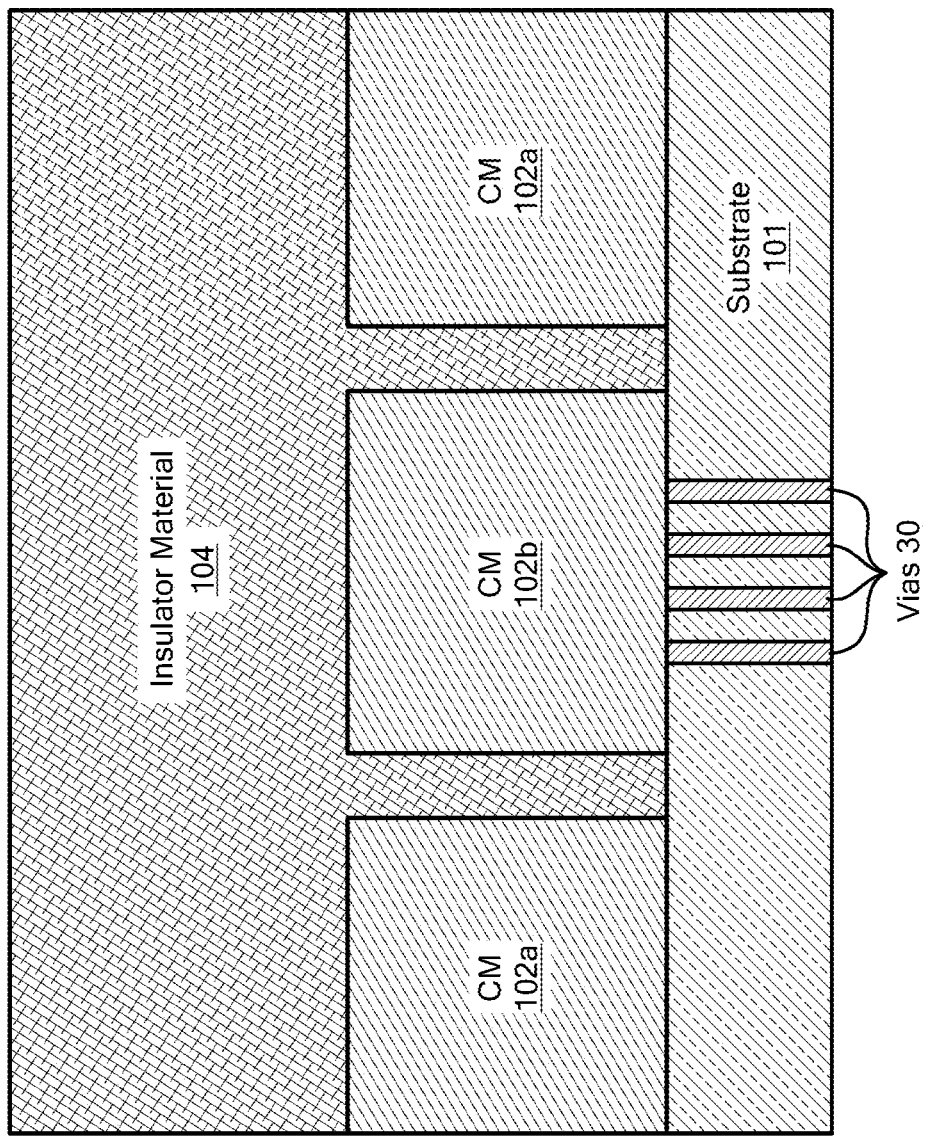

Referring to FIG. 1D, an insulator material 104 is deposited on the coil material 102a, 102b, in the gaps between the coil material 102a, the coil material 102b and on the substrate 101. In one example, the insulator material 104 is silicon dioxide.

Figure 1E:
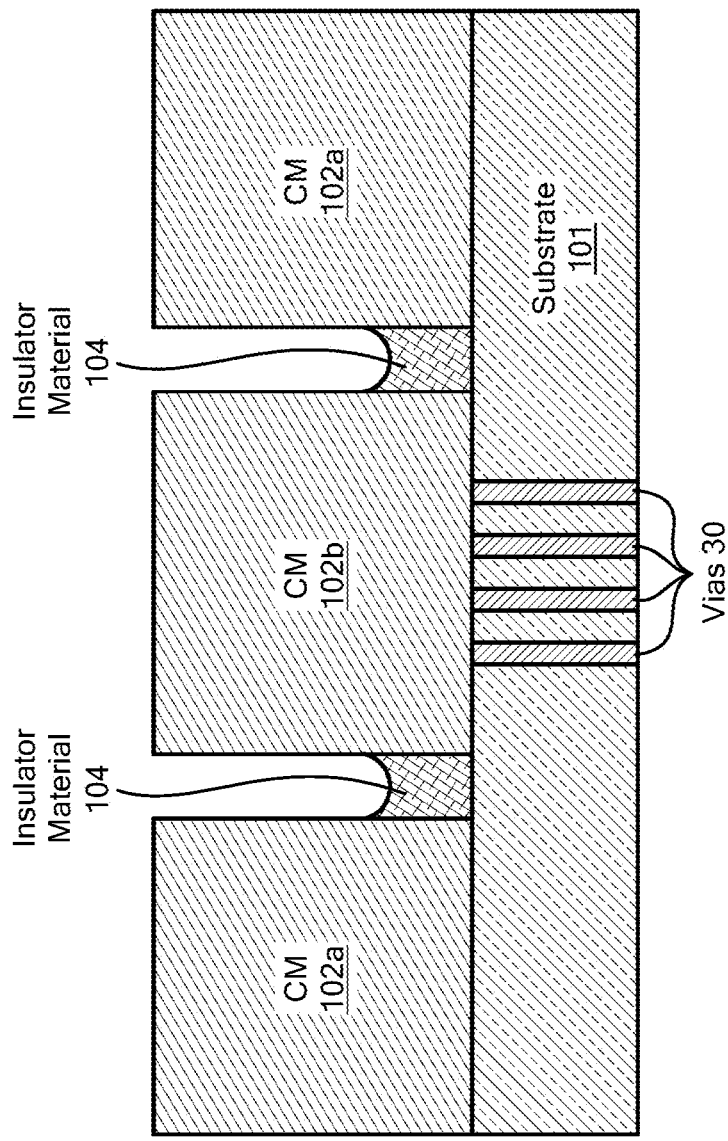
Figure 1F:
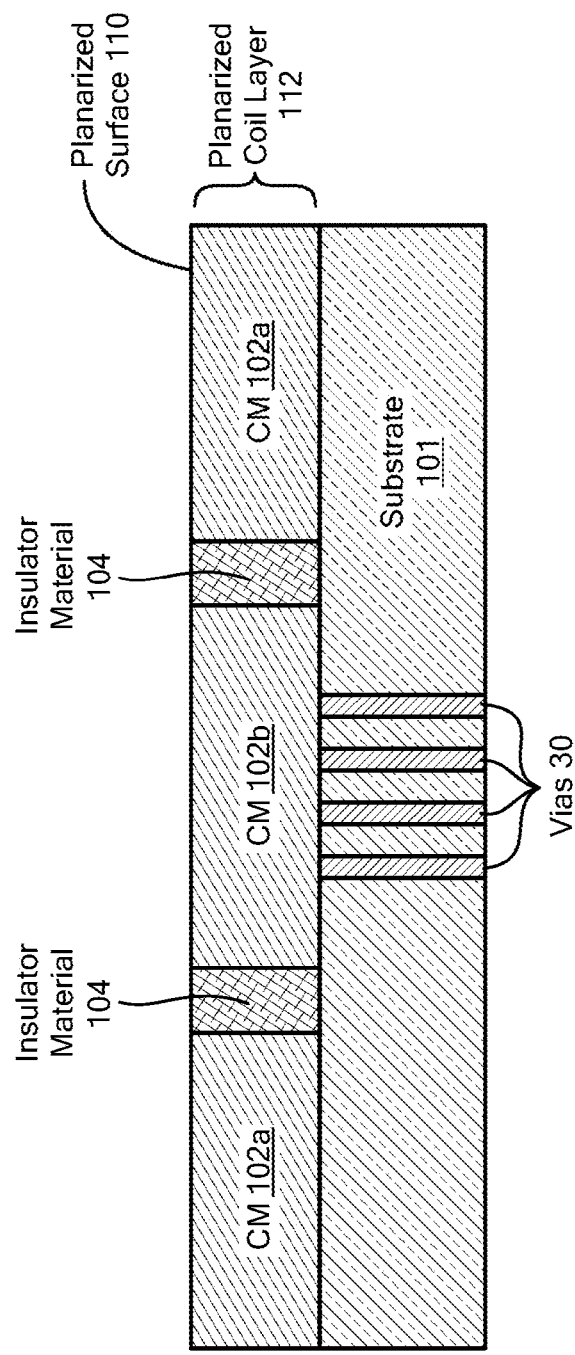

Referring to FIG. 1E, the insulator material 104 is removed down to the coil materials 102a, 102b. Referring to FIG. 1F, the coil materials 102a, 102b and the remaining insulator material 104 are planarized together to form a planarized surface 110 and the coil materials 102a, 102b and the remaining insulator material 104 form a planarized coil layer 112.

Figure 1G:
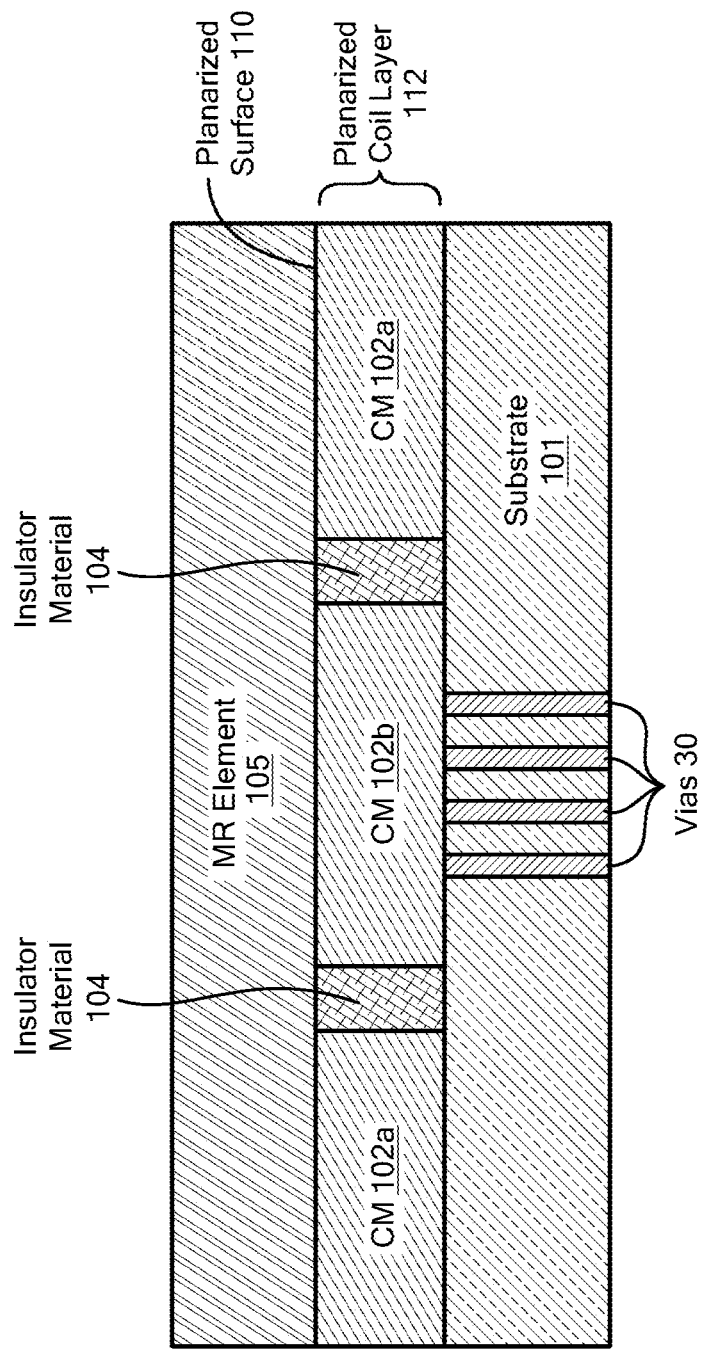

Referring to FIG. 1G, an MR element 105 is deposited on the planarized surface 110 of the planarized coil layer 112. The MR element 105 may include at least one of a tunneling magnetoresistance (TMR) element, a magnetic tunnel junction (MTJ) element and/or a giant magnetoresistance (GMR) element. In one example, the MR element 105 is a multilayer magnetoresistance stack. In other examples, the MR element 105 may be a pillar of magnetoresistance elements.

There is no dielectric material between the MR element 105 and the planarized coil layer 112. In one example, the MR element 105 is in direct contact with the planarized coil layer 112.

Figure 1H:
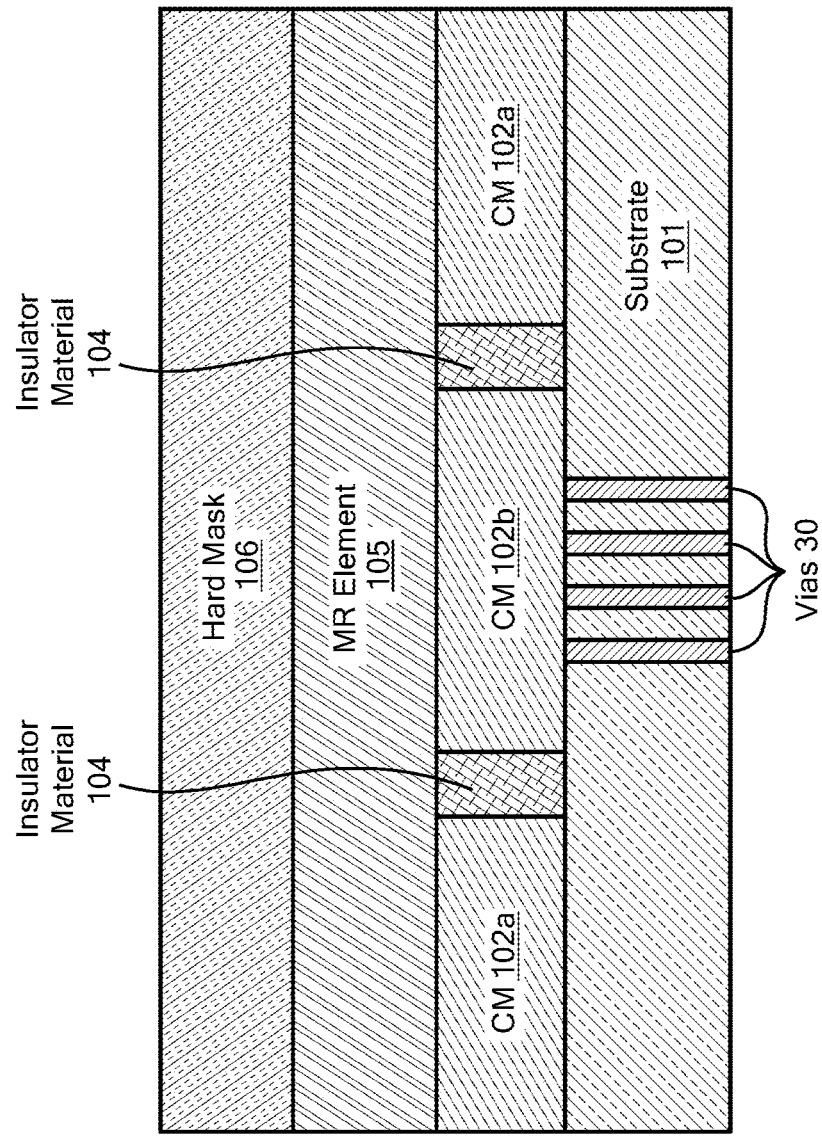

Referring to FIG. 1H, a hard mask 106 is deposited on the MR element 105. In one example, the hard mask 106 includes silicon dioxide.

Figure 1I:
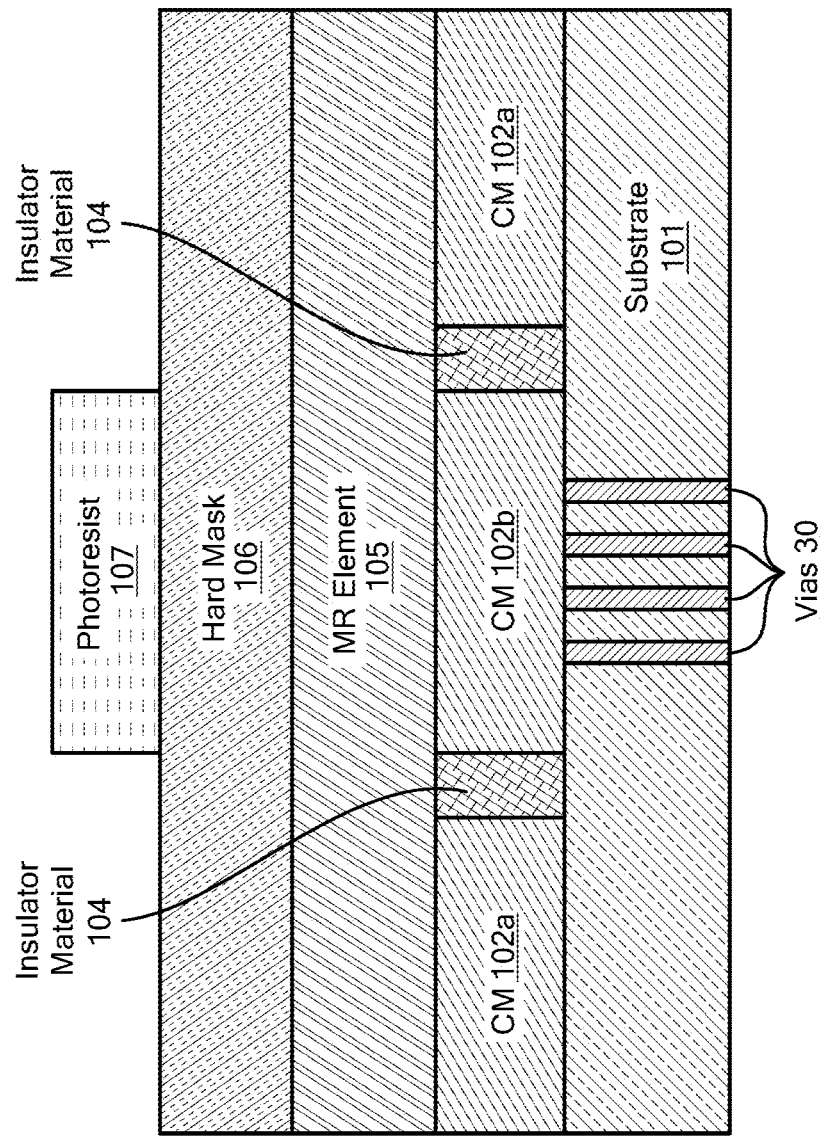
Figure 1J:
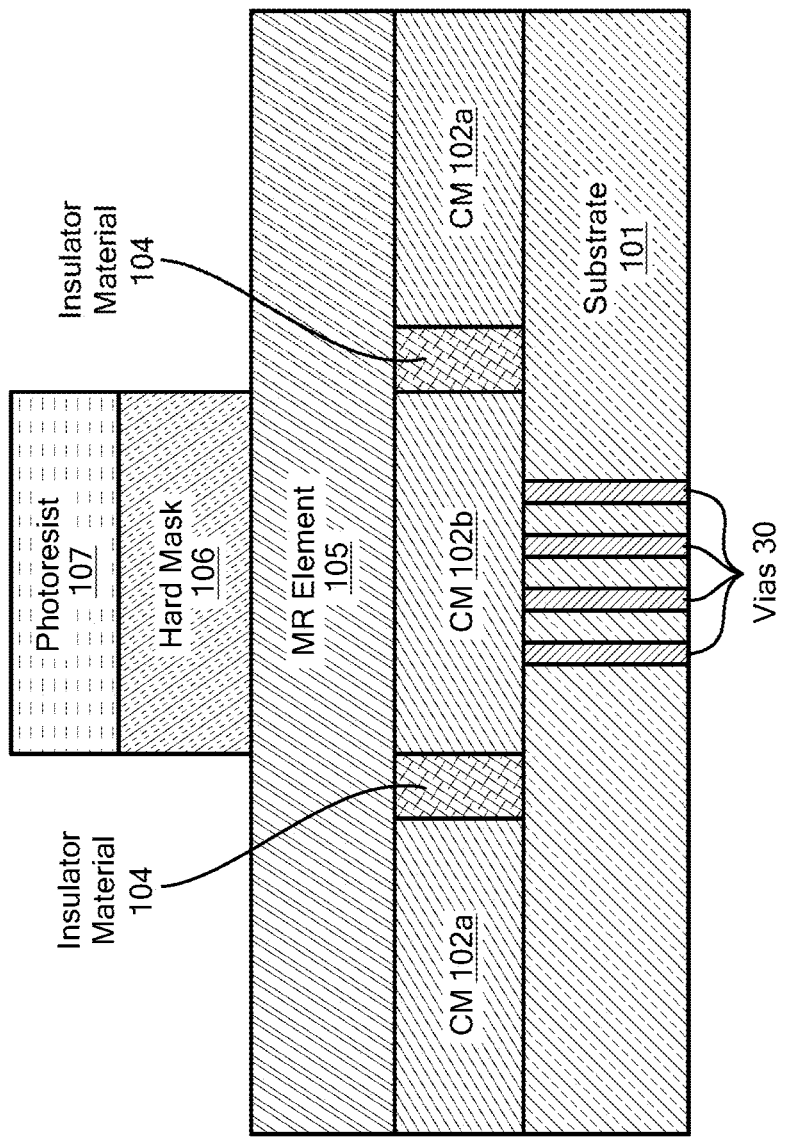

Referring to FIG. 1I, a photoresist is deposited on the hard mask 106. The photoresist is patterned using photolithography to define regions of the hard mask 106 that will be removed to define portions of the MR element 105, as shown in FIG. 1J, that will be removed. The remaining photoresist 107 protects the portions of the hard mask 102 that will not be removed.

Referring to FIG. 1J, the exposed portions of the hard mask 106 not covered by the photoresist 107 are removed. The removal of the exposed portions of the hard mask 106 exposes portions of the MR element 105.

Figure 1K:
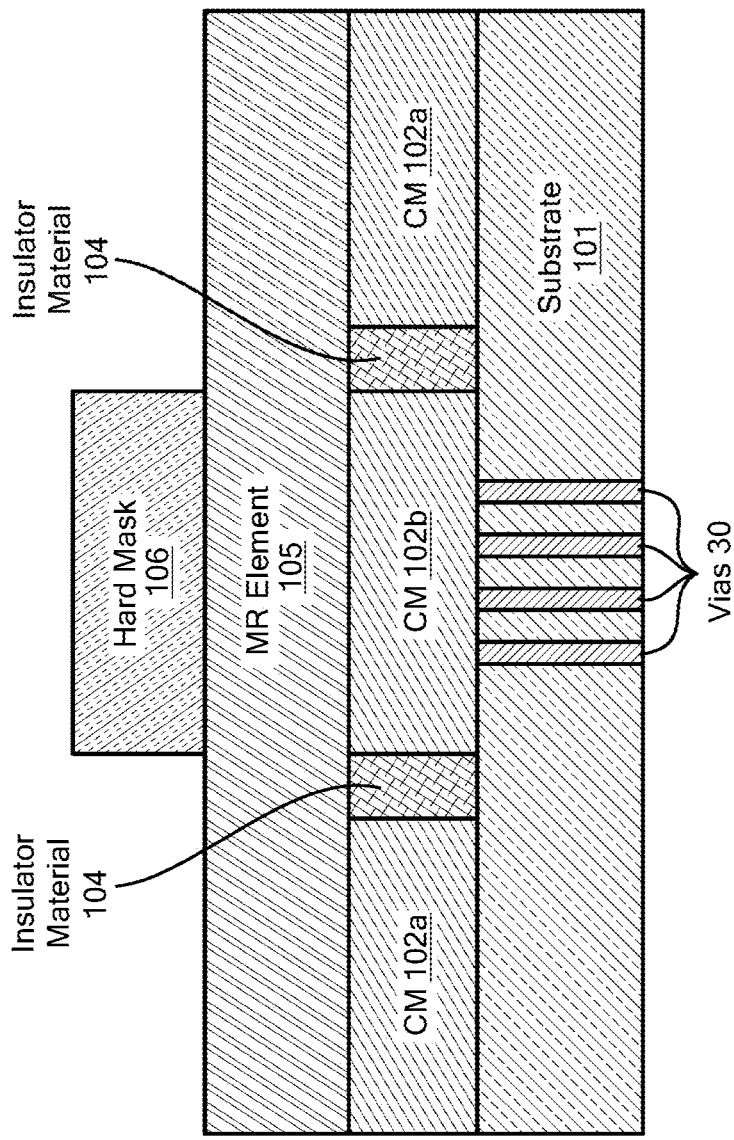
Figure 1L:
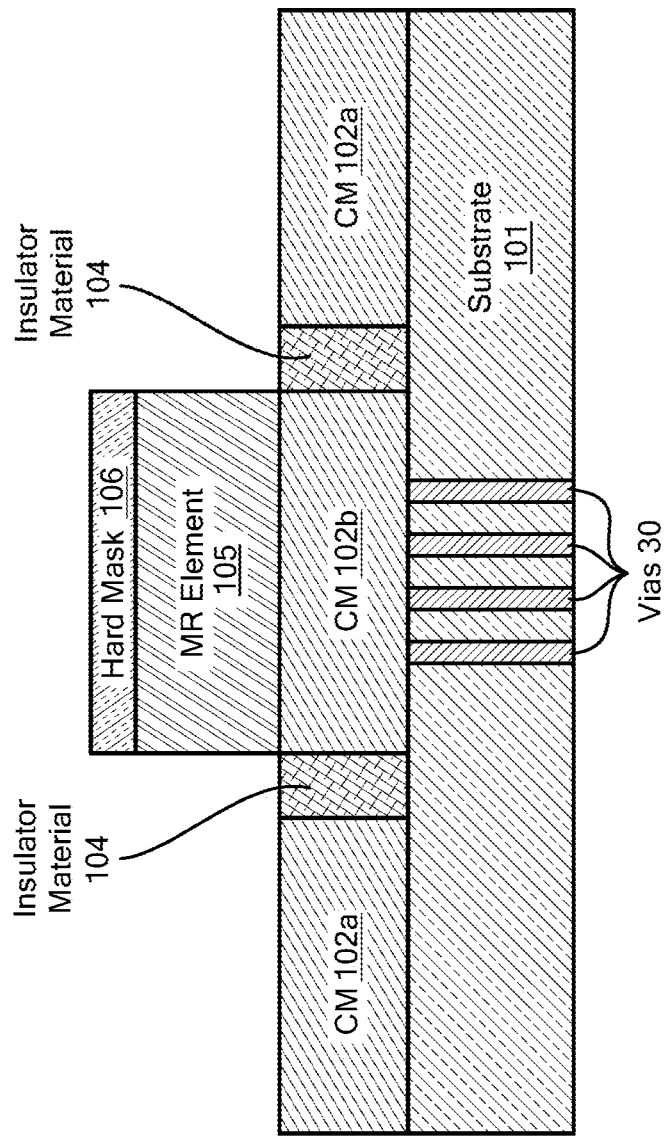

Referring to FIG. 1K, the photoresist 107 is removed. Referring to FIG. 1L, the exposed portions of the MR element 105 are removed. Also, some but not all of the hard mask 106 is also removed.

Figure 1M:
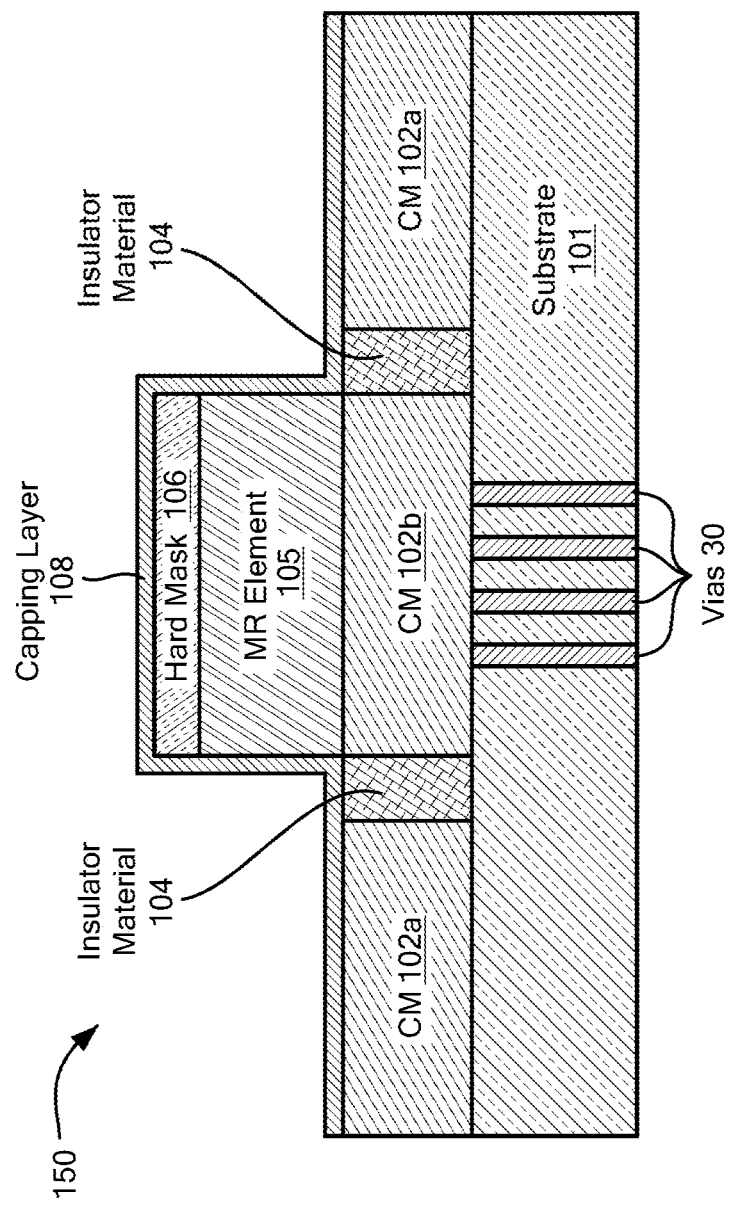

Referring to FIG. 1M, a capping layer 108 is deposited on the coil material 102a, on the hard mask 106, on the insulator material 104 and on sidewalls of the MR element 105 to protect the MR element 105 and the coil to form a magnetic field sensor 150. In one example, the capping layer 108 is silicon nitride. In this example, the coil material 102b, which is directly under the MR element 105, is not used as the coil but is used as a contact to the MR element 105.

Figure 2:
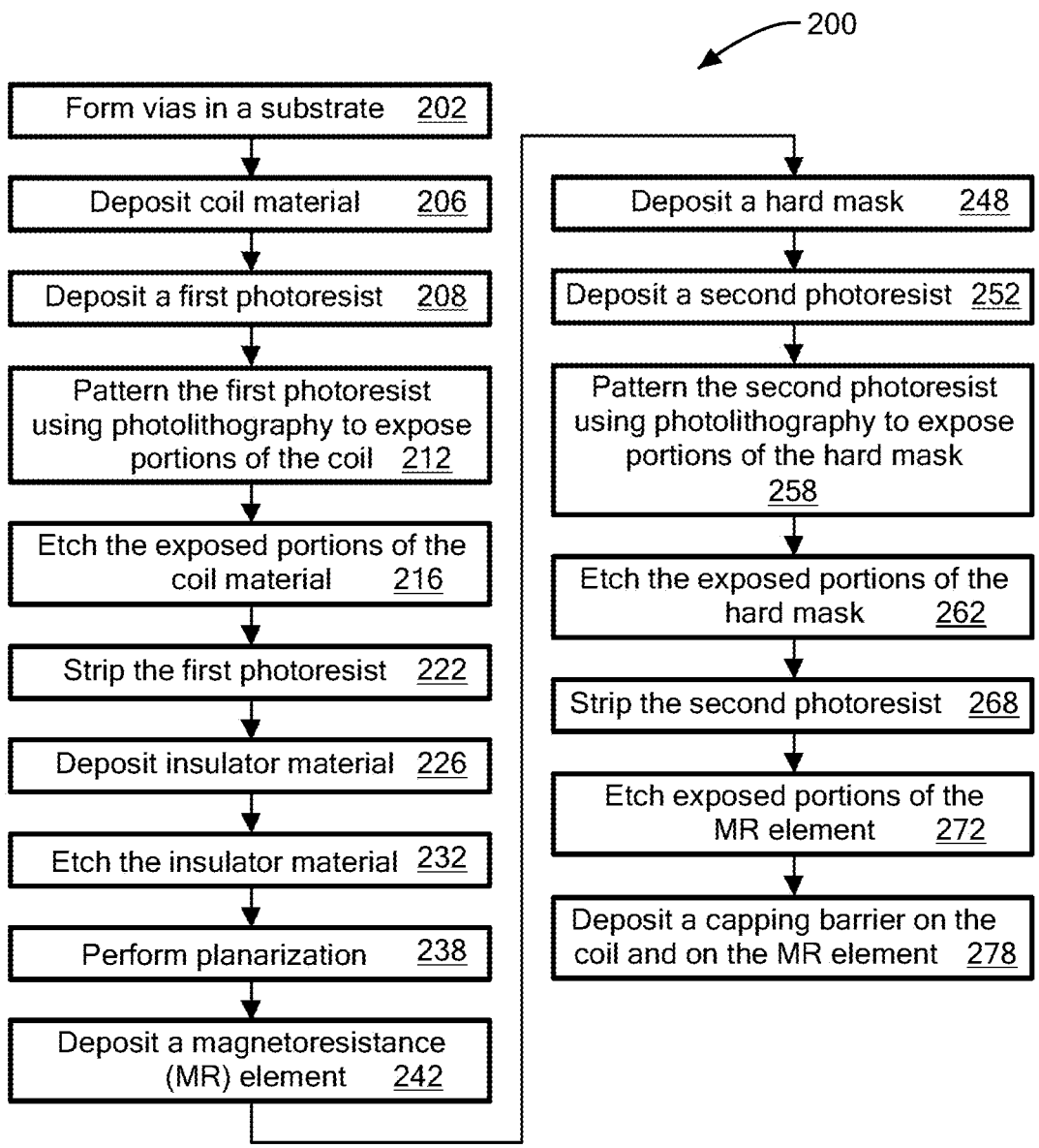
FIG. 2 is a flowchart of an example of a process to fabricate the planarized coil in contact with the MR element.

Referring to FIG. 2, an example of a process to fabricate the planarized coil in contact with the MR element is a process 200. The process 200 may be used to form the magnetic-field sensor 150 (FIG. 1M).

Process 200 forms vias in a substrate (202). For example, the substrate 101 is etched to form ducts and an electroconductive material is deposited within the ducts, as depicted in FIG. 1A.

Process 200 deposits a coil (206). For example, a sputtering process used to deposit an electroconductive material (e.g., titanium nitride) on the substrate 101, as depicted in FIG. 1A.

Process 200 deposits a first photoresist (208) and process 200 patterns the first photoresist using photolithography to expose portions of the coil (212). For example, the photoresist 103 remains after photolithography, as depicted in FIG. 1A.

Process 200 etches the exposed portions of the coil (216). In one example, the coil material 102 is etched using a standard etching process that uses the photoresist 103 as a mask, as depicted in FIG. 1B, to form the coil materials 102a, 102b.

Process 200 strips the first photoresist (222). For example, the photoresist 103 is removed using a standard photoresist stripping process, as depicted in FIG. 1C.

Process 200 deposits insulator material (226). For example, the insulator material (e.g., silicon dioxide) is deposited using a standard deposition process that completely covers the coil materials 102a, 102b, as depicted in FIG. 1D.

Process 200 etches the insulator material (232). For example, a standard etching process is used to etch the insulator material 104 down to the coil materials 102a, 102b and exposing the coil materials 102a, 102b, as depicted in FIG. 1E.

Process 200 performs planarization (238). For example, a chemical mechanical polishing (CMP) process is used to polish the coil materials 102a, 102b and the insulator material 104 together to form the planarized surface 110, as depicted in FIG. 1F.

Process 200 deposits a magnetoresistance element (242). For example, the magnetoresistance element 105 is deposited using a standard deposition process on the polarized surface 110 of the planarized coil layer 120, as depicted in FIG. 1G.

Process 200 deposits a hard mask (248). For example, a hard mask 106 (e.g., silicon dioxide) is deposited using a standard deposition process on the MR element 105, as depicted in FIG. 1H.

Process 200 deposits a second photoresist (252) and process 200 patterns the second photoresist using photolithography to expose portions of the hard mask (258). For example, a photoresist is deposited on the hard mask 106 and is patterned using standard photolithographic process leaving the remaining photoresist 107 and exposing portions of the hard mask 106, as depicted in FIG. 1I.

Process 200 etches the exposed portions of the hard mask (262). For example, the exposed portions of the mask 106 are etched using a reactive ion etch process, which expose portions of the MR element 105, as depicted in FIG. 1J.

Process 200 strips the second photoresist (268). For example, the photoresist 107 is removed using a standard photoresist stripping process, as depicted in FIG. 1K.

Process 200 etches exposed portions of the MR element (272). For example, the exposed portions of the MR element 105 are etched away using an ion beam etching process and the hard mask 106 is also eroded down, but not completely removed, as depicted in FIG. 1L. An ion beam etch is used because the MR element 105 may include various different types of chemical elements and compounds that are not easily etched in a single chemistry.

Process 200 deposits capping layer on the coil and on the MR element (278). For example, a caping layer (e.g., silicon nitride) is deposited using a standard deposition process on the hard mask 106, the coil material 102, the insulator material 104 and sidewalls of the MR element 105 to protect the MR element 105 and the coil material 102, as depicted in FIG. 1M.

Figure 3:
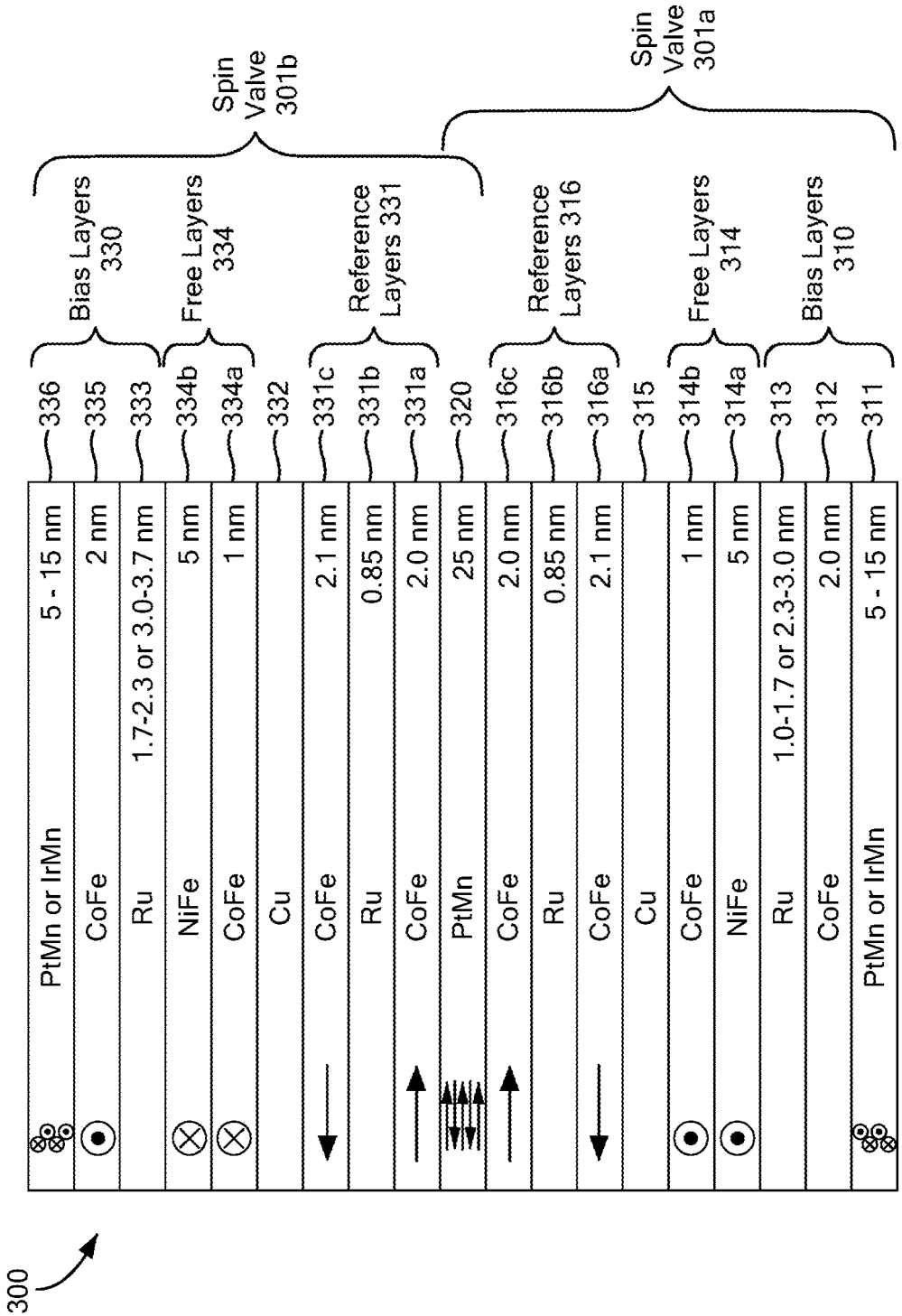
FIG. 3 is a diagram of an example of the MR element as a dual double-pinned spin valve element.

Referring now to FIG. 3, an example of the MR element 105 is an MR element 300. The MR element 300 is an example of a dual double-pinned spin valve element with pinned layers having magnetization in the same direction. The MR element 300 includes a plurality of layers. The plurality of layers includes a first spin valve 301a disposed over the nonmagnetic seed layer 302 and a second spin valve 301b disposed over the first spin valve 301a. The plurality of layers also includes an antiferromagnetic pinning layer 320, which is shared by the first spin valve 301a and the second spin valve 301b.

The first spin valve 301a includes bias layers 310, free layer 314 and reference layers 316. The bias layers 310 includes an antiferromagnetic pinning layer 311 and a ferromagnetic pinned layer 312 disposed over the antiferromagnetic pinning layer 311. The first spin valve 301a also includes a nonmagnetic spacer layer 313 disposed over the ferromagnetic pinned layer 312 with the free layers 314 structure 314 disposed over the nonmagnetic spacer layer 313. The free layers 314 includes a first ferromagnetic free layer 314a and a second ferromagnetic free layer 314b disposed over the first ferromagnetic free layer 314a.

The first spin valve 301a further includes a nonmagnetic spacer layer 315 disposed over the free layers 314 with the reference layers 316 disposed over the nonmagnetic spacer layer 315. The reference layers 316 includes a ferromagnetic layer 316a, a ferromagnetic pinned layer 316c and a nonmagnetic spacer layer 316b disposed therebetween.

The second spin valve 301b, which is similar to the first spin valve 301a, but includes layers that are in a substantially reverse order or arrangement as the layers which are shown in the first spin valve 301a with respect to the seed layer 302, includes reference layers 331 disposed over the antiferromagnetic pinning layer 320, a nonmagnetic spacer layer 332 disposed over the reference layers 331 and free layers 333 disposed over the nonmagnetic spacer layer 332. The reference layers 331 includes a first ferromagnetic layer 331a, a second ferromagnetic pinned layer 331c and a nonmagnetic spacer layer 331b disposed therebetween. Additionally, the free layers 334 includes a first ferromagnetic free layer 334a and a second ferromagnetic free layer 334b disposed over the first ferromagnetic free layer 334a.

The second spin valve 301b also includes bias layers 330. The bias layer 330 includes nonmagnetic spacer layer 333 disposed over the free layers 334, a ferromagnetic pinned layer 335 disposed over the nonmagnetic spacer layer 333 and an antiferromagnetic pinning layer 336 disposed over the ferromagnetic pinned layer 335.

Each of the layers in prior art MR element 300 includes one or more respective materials (e.g., magnetic materials) and has a respective thickness, as shown. Materials of the layers are shown by atomic symbols. Additionally, thicknesses of the layers are shown in nanometers. In other embodiments, the material and thicknesses of the layers in MR element 300 may be replaced with other materials and thicknesses.

Arrows are shown that are indicative of magnetization directions of the layers. Arrows coming out of the page are indicated as dots within circles and arrows going into the page are indicated as crosses within circles.

Figure 4:
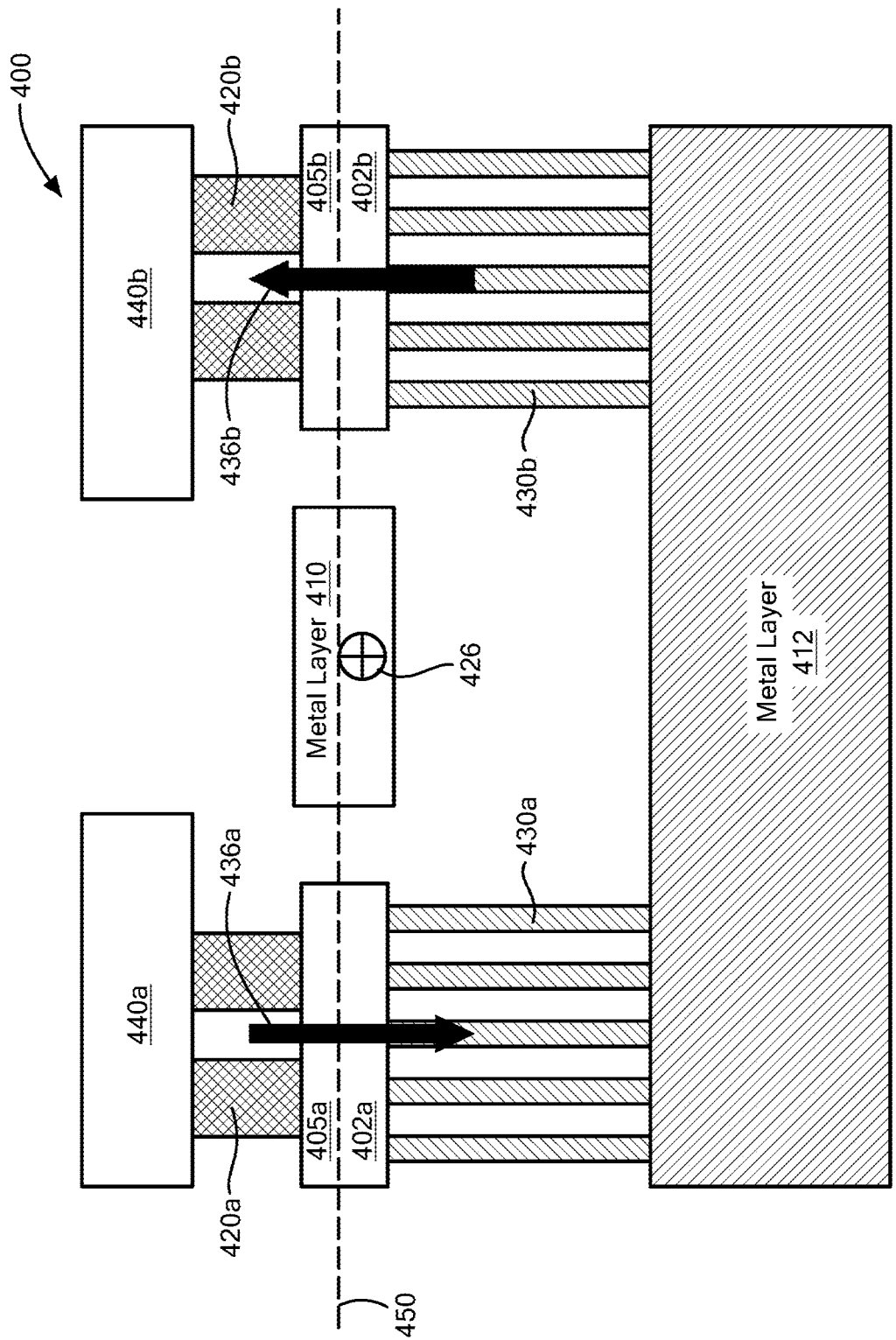
FIG. 4 is a diagram depicting the MR and the planarized coil where a metal layer may be located to generate a magnetic field.

Referring to FIG. 4, a configuration 400 includes a metal layer (e.g., a metal layer 410) between coils 402a, 402b and MR elements 405a, 405b. A metal layer 410 is on the same plane as the MR elements 405a, 405b or a plane that is parallel to the plane 450.

Metal interconnects (e.g., a metal interconnect 420a) connect to a metal layer 440a on one end and to the MR element 405a on the other end. Metal interconnects (e.g., a metal interconnect 420b) connect to a metal layer 440b on one end and to the MR element 405b on the other end. Vias (e.g., via 430a) connect the coil 402a to the metal layer 412. Vias (e.g., via 430b) connect the coil 402b to the metal layer 412.

A current flows in the metal layer 410 in a direction 426 (i.e., into the page) and causes a magnetic field in a direction 436a in the MR element 405a and a magnetic field in a direction 436b (antiparallel to the direction 436a) in the MR element 405a. The directions 436a, 436b are also orthogonal to the plane 450.

The processes described herein are not limited to the specific examples described. For example, the process 200 is not limited to the specific processing order of FIG. 2. Rather, any of the processing blocks of FIG. 2 may be re-ordered, combined, or removed, performed in parallel or in serial, as necessary, to achieve the results set forth above.

Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

What is claimed is:

1. A method, comprising:
    depositing electroconductive material on a substrate to form a coil layer;
    forming a coil and a connector from the electroconductive material in the coil layer;
    depositing an insulator material between the coil and the connector;
    performing planarization on the coil layer to form a planarized coil layer; and
    depositing a magnetoresistance (MR) element in direct contact with the connector in the planarized coil layer.

2. The method of claim 1, further comprising:
    depositing a hard mask on the MR element;
    depositing a photoresist on the hard mask;
    patterning the photoresist using photolithography to expose portions of the hard mask;
    etching the exposed portions of the hard mask to expose portions of the MR element;
    stripping the photoresist; and
    etching the exposed portions of the MR element.

3. The method of claim 2, further comprising, after etching the exposed portions of the MR element, depositing a capping barrier directly on the hard mask, sidewalls of the MR element and the planarized coil layer.

4. The method of claim 1, wherein depositing the MR element comprises depositing at least one of a tunneling magnetoresistance (TMR) stack, a magnetic tunnel junction (MTJ) stack and/or a giant magnetoresistance (GMR) stack.

5. The method of claim 1, further comprising forming vias in the substrate in direct contact with the connector.

6. A method, comprising:
    forming a coil and a connector in a coil layer, wherein forming the coil comprises:
        depositing an electroconductive material on a substrate;
        depositing a first photoresist;
        patterning the first photoresist using photolithography to expose portions of the electroconductive material; and
        etching the exposed portions of the electroconductive material to form the coil and the connector;
        stripping the first photoresist;
    performing planarization on the coil layer to form a planarized coil layer;
    depositing a magnetoresistance (MR) element directly on the connector in the planarized coil layer;
    depositing insulator material on the substrate between the coil and the connector;
    etching the insulator material; and
    depositing a capping barrier over the MR element and the planarized coil layer.

7. The method of claim 6, further comprising:
    depositing a hard mask on the MR element;
    depositing a second photoresist on the hard mask;
    patterning the second photoresist using photolithography to expose portions of the hard mask;
    etching the exposed portions of the hard mask to expose portions of the MR element;

stripping the second photoresist; and
etching the exposed portions of the MR element.

8. The method of claim 7, wherein depositing the hard mask comprises depositing the hard mask comprising silicon dioxide.

9. The method of claim 7, wherein etching the exposed portions of the hard mask comprises using a reactive ion etch process.

10. The method of claim 7, wherein etching the MR element comprises using a reactive ion beam etching process.

11. The method of claim 7, wherein depositing the capping barrier comprises depositing a capping barrier comprising silicon nitride.

12. The method of claim 6, further comprising forming vias in the substrate before depositing the electroconductive material on the substrate.

13. The method of claim 6, wherein depositing the electroconductive material on the substrate comprises depositing the electroconductive material on a silicon nitride substrate or a silicon dioxide substrate.

14. The method of claim 12, wherein forming the vias comprises forming vias with tungsten.

15. The method of claim 6, wherein depositing the electroconductive material comprises depositing titanium nitride.

16. The method of claim 6, wherein depositing the electroconductive material comprises sputtering the electroconductive material on the substrate.

17. The method of claim 6, wherein depositing the MR element comprises depositing at least one of a tunneling magnetoresistance (TMR) stack, a magnetic tunnel junction (MTJ) stack and/or a giant magnetoresistance (GMR) stack.

18. The method of claim 6, wherein depositing the insulator material comprises depositing silicon dioxide.

19. The method of claim 6, wherein performing planarization on the coil comprises performing chemical mechanical polishing.

20. The method of claim 6, wherein depositing the insulator material on the coil comprises depositing the insulator material to completely cover the coil.

21. A magnetic field sensor, comprising:
a substrate;
a planarized coil layer comprising a coil and a connector on the substrate;
a magnetoresistance (MR) element in direct contact with the connector in the planarized coil layer; and
a capping layer deposited over the MR element and the planarized coil layer.

22. The magnetic field sensor of claim 21, wherein the MR element comprises at least one of a tunneling magnetoresistance (TMR) element, a magnetic tunnel junction (MTJ) element and/or a giant magnetoresistance (GMR) element.

23. The magnetic field sensor of claim 21, further comprising insulator material between portions of the coil.

24. The magnetic field sensor of claim 21, wherein the substrate includes vias having an electroconductive material.

25. The magnetic field sensor of claim 21, further comprising a hard mask between the capping layer and the MR element.

26. A magnetic field sensor, comprising:
a substrate;
a planarized coil layer comprising a coil on the substrate;
a magnetoresistance (MR) element in contact with the planarized coil layer, wherein no dielectric material is between the planarized coil layer and the MR element;
a capping layer deposited over the MR element and the planarized coil layer; and
a metal layer,
wherein the MR element is located on a first plane,
wherein the metal layer is on the first plane or on a plane parallel to the first plane, and
wherein the metal layer is configured to generate a magnetic field having a first direction in the MR element that is perpendicular to the first plane in response to a current being applied to the metal layer.

27. The magnetic field sensor of claim 26, wherein the MR element is a first MR element,
further comprising a second MR element located on the first plane,
wherein the metal layer is configured to generate a magnetic field having a second direction in the second MR element that is perpendicular to the first plane in response to the current being applied to the metal layer, and
wherein the first direction is antiparallel to the second direction.

28. The magnetic field sensor of claim 26, wherein the MR element is in direct contact with the planarized coil layer.

* * * * *